United States Patent [19]

Roach et al.

[11] 4,306,013
[45] Dec. 15, 1981

[54] ASYMMETRICAL RADIATION EXPOSURE OF SPIN COATED PHOTORESIST TO OBTAIN UNIFORM THICKNESS COATING USED TO REPLICATE SPIRAL GROOVES IN PLASTIC SUBSTRATE

[75] Inventors: William R. Roach, Rocky Hill; William C. Henderson, III, West Windsor Township, Mercer County, both of N.J.

[73] Assignee: RCA Corporation, New York, N.Y.

[21] Appl. No.: 128,870

[22] Filed: Mar. 10, 1980

[51] Int. Cl.³ .................. G01D 15/34; G03C 5/00; G11B 7/00; H04N 5/76
[52] U.S. Cl. ........................... 369/288; 430/5; 430/18; 430/321; 430/326; 430/327; 430/328; 430/329; 430/296; 430/320; 358/128.5; 358/129; 346/137; 264/107
[58] Field of Search ............... 430/326, 325, 327, 328, 430/329, 24, 320, 321, 189, 197, 5, 18, 296; 358/6, 7, 128.5, 128.6, 129, 130; 179/100.3 R, 100.3 A, 100.3 G, 100.3 K, 100.3 V; 346/137

[56] References Cited

U.S. PATENT DOCUMENTS

| | | | |
|---|---|---|---|
| 3,645,734 | 2/1972 | Noguchi | 430/321 |
| 3,841,875 | 10/1974 | Park et al. | 430/25 |
| 3,842,194 | 10/1974 | Clemens | 178/6.6 A |
| 3,943,302 | 3/1976 | Johnston | 179/100.3 A |
| 3,950,173 | 4/1976 | Ross et al. | 430/197 |
| 4,104,832 | 8/1978 | Keizer | 51/281 R |
| 4,162,510 | 7/1979 | Keizer | 358/128 |

OTHER PUBLICATIONS

Ryan, *RCA Review*, vol. 39, pp. 87–115, 3/78.
Firester et al., *RCA Review*, vol. 39, pp. 427–471, 9/78.
Albert et al., Journal of the Electrochemical Society, vol. 109, pp. 710–712, 8/62.

*Primary Examiner*—Charles L. Bowers, Jr.
*Attorney, Agent, or Firm*—Birgit E. Morris; Allen Bloom

[57] ABSTRACT

An improved method for replicating a spiral groove pattern. The pattern is recorded in a photoresist layer which is then developed to reproduce the pattern in the photoresist layer. The pattern is transferred to a metal layer and formed in the surface of a plastic substrate. The improvement comprises the additional steps of asymmetrically irradiating the photoresist layer and removing the irradiated photoresist surface layer to produce a photoresist layer of uniform thickness.

8 Claims, 4 Drawing Figures

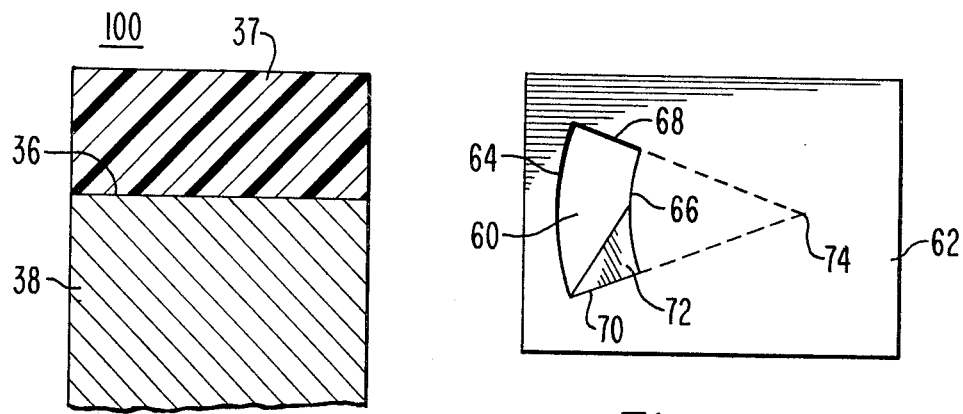
Fig. 1.
Fig. 3.
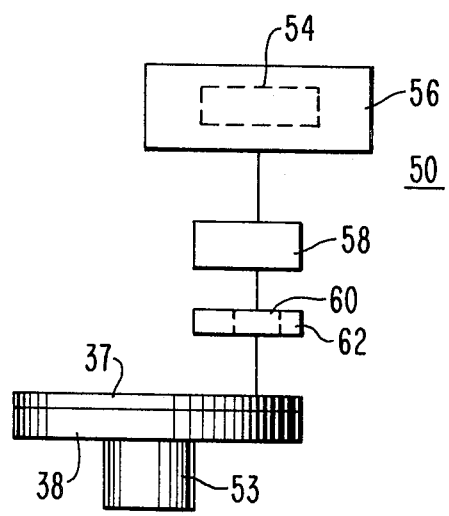
Fig. 2.

ASYMMETRICAL RADIATION EXPOSURE OF SPIN COATED PHOTORESIST TO OBTAIN UNIFORM THICKNESS COATING USED TO REPLICATE SPIRAL GROOVES IN PLASTIC SUBSTRATE

This invention relates to a method of preparing deep-grooved discs for stylus lapping. More particularly, this invention relates to a method of preparing keel lapping discs having uniform groove depths which can be used to fabricate playback styli.

BACKGROUND OF THE INVENTION

U.S. Pat. No. 3,842,194 of Clemens discloses a video disc having a playback system utilizing variable capacitance. In one configuration of the Clemens system information representative of recorded picture and sound is encoded in the form of a relief pattern in a relatively fine spiral groove on the surface of a disc record. For example, groove widths about 2.7 micrometers and groove depths of about 0.5 micrometer may be used. During playback, a pickup stylus about 2.0 micrometers wide having a thin conductive electrode thereon, for example, about 0.2 micrometer thick, engages the groove as the record is rotated by a supportive turntable. Capacitive variations between the stylus electrode and the record surface are sensed to recover the prerecorded information.

Keizer, in U.S. Pat. No. 4,162,510 entitled "Keel Tipped Stylus for Video Disc Systems" which is incorporated herein by reference, discloses a playback stylus which may be used with the Clemens system. The keel tipped pickup stylus comprises a dielectric support element having a body, a constricted terminal portion and shoulders interconnecting the body with the constricted terminal portion.

The constricted terminal portion is defined by a prow, a substantially flat rear surface remote from said prow, a plurality of substantially parallel side surfaces extending from the side edges of the rear surface, a bottom surface extending from the bottom edge of the rear surface and a plurality of additional surfaces extending from the prow and intersecting the bottom and the side surfaces. The maximum separation between the substantially parallel side surfaces is less than the given groove width.

Keizer, in U.S. Pat. No. 4,104,832 incorporated herein by reference, discloses a method for manufacturing the keel tipped stylus. To form a keel tipped stylus a tapering support element made from a hard dielectric material, such as diamond or sapphire, is contacted with an abrasive lapping disc having a deep, coarse pitched groove. The lands on the lapping disc lap the shoulders of the keep tipped stylus and the walls of the abrasive groove form the substantially parallel side surfaces of the constricted terminal portion.

Abrasive discs can be generated by a method described in an article by Ryan entitled "Material and Process Development for Video Disc Replication", *RCA Review*, Vol. 39, pages 87–115 (1978). A master recording is preferably made in photoresist by optical recording techniques, although electron beam or electromechanical recording means may also be employed. A metal matrix master which is a negative replica of the surface of the photoresist master recording is prepared from the photoresist master. A metal matrix mold which is a positive replica of the photoresist master is prepared from the metal matrix master. A metal stamper is then prepared from the metal matrix mold. The metal stamper is a negative of the photoresist master and is used to fabricate plastic discs having the appropriate groove pattern in its surface. The disc is then coated with an abrasive.

Carroll et al in their copending application entitled "Method for Preparing Stylus Lapping Discs", Ser. No. 118,088, filed Feb. 4, 1980, incorporated herein by reference, teach an improved method for preparing keel lapping discs. In their method the junctions in the metal matrix master are filled in to form concave junctions.

Roach et al in their copending application entitled "Method for Preparing Keel Lapping Discs", Ser. No. 128,871 which is being filed concurrently and is incorporated herein by reference, describe an improved method for replicating a spiral groove pattern. In this method, the photoresist master is uniformly irradiated and the irradiated photoresist surface layer is removed. As a result the groove pattern is fully reproduced in the metal matrix master.

Another problem encountered during the replication of the spiral groove pattern is the difficulty in obtaining a uniform, thick coating of photoresist. The thickness in any area is a complex function of a number of factors including spin speed, photoresist composition, temperature and humidity. If the photoresist is applied by spin coating, the resulting photoresist layer may be made axially symmetric, but there is generally considerable variation in photoresist layer thickness as a function of radius. Thus, for example, the photoresist layer may become thinner as the radius decreases. These thickness variations result in lapping discs which are nonuniform and therefore cause difficulties when the stylus lapping process is automated.

SUMMARY OF THE INVENTION

We have found an improved method for replicating a spiral groove pattern in which the groove depths are uniform throughout the replicated pattern. The pattern is recorded in a photoresist layer which is then developed to reproduce the pattern in the photoresist layer. The pattern is transferred to a metal layer and formed in the surface of a plastic substrate. The improvement comprises the additional steps of asymmetrically irradiating the photoresist layer and removing the irradiated photoresist surface area to produce a photoresist layer of uniform thickness.

BRIEF DESCRIPTION OF THE DRAWINGS

FIG. 1 is a cutaway transverse view of a photoresist layer overlying a substrate.

FIG. 2 is a schematic of an exposure apparatus which can be used to carry out this invention.

FIG. 3 is a front view of a blocking plate used in conjunction with the exposure apparatus.

DETAILED DESCRIPTION OF THE INVENTION

Figure 4:
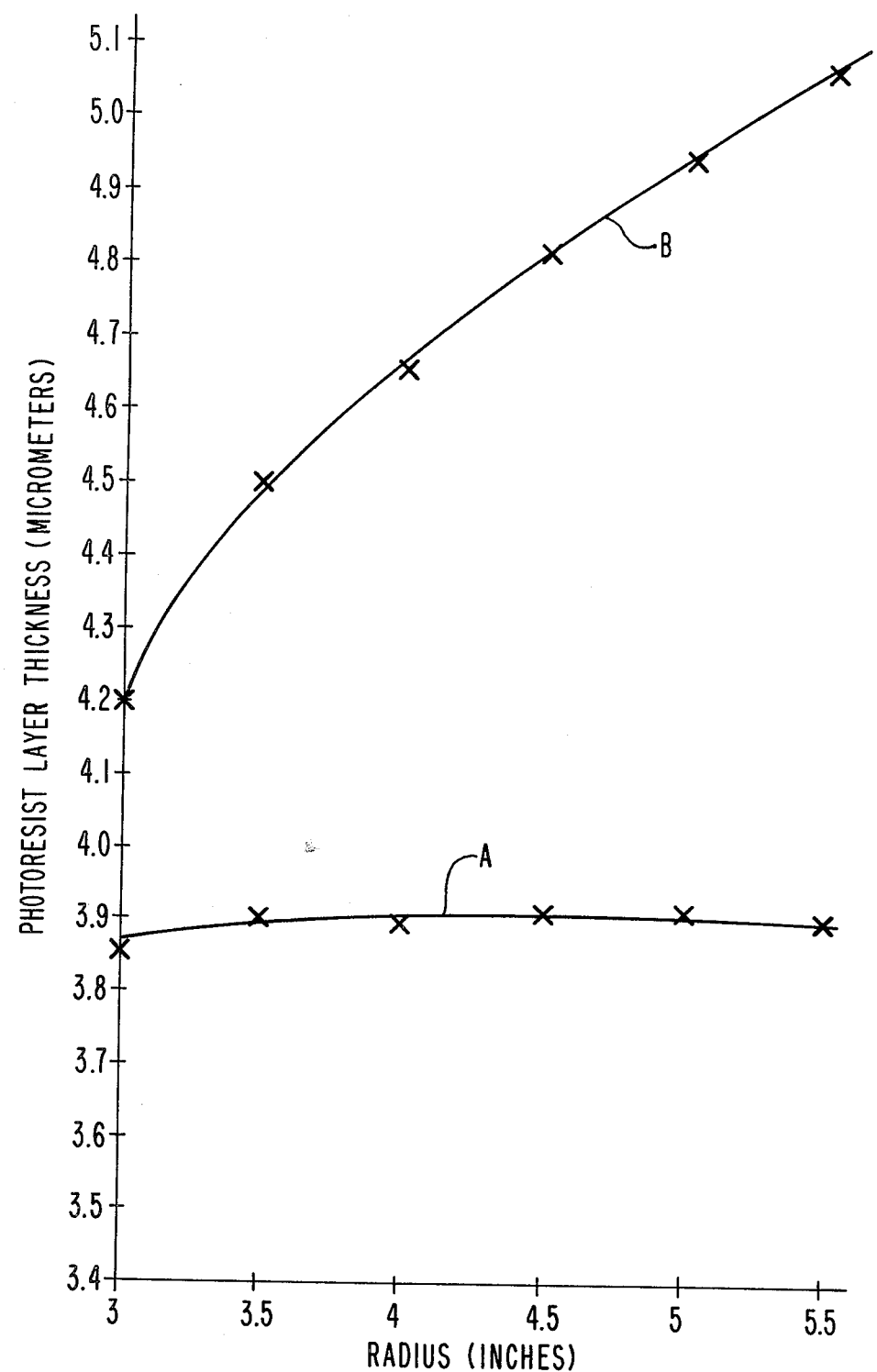
FIG. 4 is a plot of the thickness profile of the photoresist layer overlying the substrate both before and after using this invention.

A convenient method of preparing suitable spiral grooved lapping discs is by means of optical recording techniques. A discussion of optical recording techniques may be found in an article by A. H. Firester et al entitled "Optical Recording Techniques for the RCA Video Disc", *RCA Review*, Vol. 39, No. 3, pgs. 427-471 (1978).

A useful class of positive working photoresists employs an orthoquinone diazide derivative of naphthalene along with an alkali soluble resin such as novolak resins, cellulose derivatives, homopolymers and copolymers of vinyl acetate and the like. Suitable photoresists include Shipley AZ1350, available from the Shipley Co., and a photoresist comprising a mixture of 2,4-bis(6-diazo-5,6-dihydro-5-oxo-1-naphthalene-sulfonyloxy)-benzophenone and an alkali soluble novolak resin prepared from cresol and formaldehyde, as described in Ross, U.S. Pat. No. 3,950,173 and incorporated herein by reference.

Any smooth substrate to which the photoresist adheres can be used. A particularly useful substrate is a bright copper layer electroplated upon a smoothly machined, flat aluminum disc. The copper is given a fine machine finish and the photoresist solution is applied to the substrate in order to produce a solvent-free layer, typically about 3-5 micrometers thick, which is uniform and pin-hole free. A convenient way of applying the photoresist solution is by spin coating. The photoresist layer may be baked to remove any residual solvent.

FIG. 1 is a cutaway transverse view of the substrate 38 covered on the substrate surface 36 with a photoresist layer 37. The reflection spectrum from the substrate surface 36 which is overcoated with the photoresist layer 37 is measured in order to determine if there are radial inhomogeneities in the thickness of the photoresist layer 37. The photoresist layer 37 thickness is generally uniform around any circumference of a given radius but varies with radius.

The wavelengths used to measure the reflectivity of the substrate surface 36 should be those which are both not significantly absorbed by the photoresist layer 37 and sufficiently reflected to be measurable. The thickness (t) of the photoresist layer at the radius sampled is determined by the formula $$t = \frac{1}{\left(\frac{N1}{\lambda 1} - \frac{N2}{\lambda 2}\right)} \cdot \frac{\Delta M}{2}$$

wherein $\lambda 1$ and $\lambda 2$ are wavelengths at which minima in the reflection spectrum occur, N1 and N2 are the refractive indices of the photoresist layer at minima in the reflection spectrum at $\lambda 1$ and $\lambda 2$, respectively, $\Delta M$ is the difference in the interference order numbers between the minima at $\lambda 1$ and $\lambda 2$. The interference order number is the number of wavelengths of light which can fit into a photoresist layer of a given thickness. For two adjacent minima in the reflection spectrum the value of $\Delta M$ is one (1). For a further discussion of technique used to measure the thickness of films see, for example, M. P. Albert et al, *Journal of the Electrochemical Society*, Vol. 109, No. 8, pgs. 710-12 (1962). After the photoresist layer 37 thickness profile is established, the desired groove pattern, for example, a trapezoid groove shape for a stylus lapping disc, may be recorded with a laser optical recording system.

If the photoresist layer 37 thickness profile is not satisfactory, that is, the thickness changes as a function of the substrate 38 radius, the profile can be made uniform by exposing the photoresist layer 37 to actinic radiation. The radiation must be absorbed by the photoresist layer 37 so that the layer is made preferentially more soluble in a solvent than unirradiated regions. The photoresist layer is asymmetrically exposed to this radiation so that the thicker regions receive a greater exposure than the thinner regions. The resulting differences in solubility can be exploited by employing a solvent which preferentially dissolves the exposed regions. The greater the exposure level the more material should be dissolved if a proper solvent is chosen. The unexposed regions should be essentially unaffected by the solvent. It is preferable that the same solvent which removes the asymmetrically exposed regions also functions as a solvent developer for the spiral groove pattern recorded in the photoresist layer 37.

An exposure apparatus 50 for carrying out the asymmetric exposure is shown as a schematic in FIG. 2. The substrate 38 covered with the photoresist layer 37 is placed on a turntable 53. A lamp such as a mercury or xenon arc lamp 54 is mounted in a housing 56. The exposure onto the photoresist layer 37 is controlled by means of a shutter 58. A wedge-shaped opening 60 in a blocking plate 62 can be conveniently used with this exposure apparatus 50 to tailor the area of the photoresist layer 37 which is irradiated. The distance between the lamp 54 and the photoresist layer 37 is preferably great enough so that the entire photoresist layer 37 area which will contain the spiral groove pattern is exposed in a single run. The exposure may be either before or after the spiral groove pattern is recorded in the photoresist, and may be before or after the recorded spiral groove pattern is developed. The light source is not limited to a lamp and can be any light source, such as a laser, which will allow the irradiated photoresist layer 37 surface to be removed. A convenient method is to combine the steps of removing the irradiated photoresist layer surface and developing the recorded spiral groove pattern.

A wedge-shaped opening 60 which can be used to tailor the exposure level of the photoresist layer 37 at different radii is shown in FIG. 3 as part of a blocking plate 62. The blocking plate 62 is preferably constructed out of a rigid material which does not transmit any of the incident radiation. A suitable material is a metal such as aluminum. The opening 60 consists of two parallel arcs 64 and 66 connected by two straight, axially-converging sides, first side 68 and second side 70. A portion of the opening is blocked off by a mask 72 which at various radii allows a predetermined amount of radiation to impinge on the photoresist layer 37 surface.

Following the asymmetric exposure and recording of the spiral groove pattern, the photoresist layer 37 is developed by contacting it with a solvent developer which selectively removes the more soluble photoresist layer portion and develops the recorded grooved pattern. Alternatively, the recording and development of the spiral groove pattern may be done either before or after the asymmetric exposure and removal of the irradiated photoresist layer 37 surface. The further steps in the replication process described in the previously discussed copending applications of Roach et al and Carroll et al may be employed to produce stylus lapping discs for preparing playback styli. The filling in step disclosed in the copending application of Carroll et al may be included in order to improve separation of the metal parts generated during replication and to obtain styli having extended useful lives. Alternatively, the flood exposure step taught in the copending application of Roach et al may be combined with the instant invention by allowing sufficient actinic radiation to impinge on the photoresist layer 37 to correct for any cusp formation which occurs due to undercutting during development. If the latter approach is followed, the photoresist layer 37 thickness should be adjusted so that grooves of the desired depth are obtained.

The present invention will be further illustrated by the following Example, but it is to be understood that the invention is not meant to be limited to the details described herein.

EXAMPLE

A 30 percent weight to volume photoresist solution was prepared by dissolving 8.5 parts of a cresoformaldehyde novolak resin (Alnovol 429-K) and 1.5 parts of 2,4 bis(6-diazo-5,6-dihydro-5-oxo-1-naphthalene-sulfonyloxy)benzophenone in 2-methoxyethyl acetate. The solution was spin coated at about 300 rpm onto a 0.5 millimetr thick, fine-finish machined, bright copper layer which had been electroplated onto a 14 inch (35.6 centimeter) diameter, 0.5 inch (1.27 centimeter) thick flat, aluminum disc which had been machined smooth. The resulting photoresist layer was baked in the air for 3 hours at 70° C. to remove any residual solvent.

The reflection spectrum of the coated substrate was measured over the range of 480-600 nanometers for areas located at 3, 3.5, 4, 4.5, 5 and 5.5 inches (7.62, 8.89, 10.16, 11.43, 12.70 and 13.97 cm, respectively) from the center of the disc. The interference pattern was analyzed to give the photoresist thickness at these points. The thickness profile for the photoresist layer 37 is plotted in FIG. 4, plot B. In FIG. 4 the horizontal coordinate is the radius in inches and the vertical coordinate is the calculated thickness in micrometers. The thickness was uniform around the circumference for any given radius.

The spiral groove pattern was next recorded using a laser optical recording system. An RCA model LD2186 20 milliwatt He-Cd gas laser with about a 1 millimeter diameter beam having a wavelength of 441.6 nanometers was employed as the recording laser.

The photoresist layer 37 was then exposed using the exposure apparatus 50 shown in FIG. 2. An unfiltered 100 watt mercury arc lamp in a lamp projector, Model H-2862-33, available from Lebex Co., Dayton, Ohio, which included a 45° mirror in the housing, was the light source.

The blocking plate 62 was constructed out of aluminum and contained a wedge-shaped opening 60. The two straight sides 68 and 70, respectively, if extended would meet at a point 74, which corresponded to the axis of the substrate at an angle of 30°. The distance between the two arcs 64 and 66 was 7.6 centimeters as measured along either of the straight sides 68 and 70. The radius, as measured from the axis point 74, of the larger arc 64 was 15.2 centimeters. For the smaller arc 66, the radius was 7.6 centimeters. The distance along a straight line between the straight sides 68 and 70 where they intersect the larger arc 64 was 8 centimeters. Where they intersect the smaller arc 66, the distance was 4 centimeters. The distance between the blocking plate 62 and the photoresist layer 37 was about 1 inch (2.54 cm), and the distance between the lamp 54 and the blocking plate 62 was about 27.25 inches (69.22 cm).

In order to obtain a photoresist layer 37 of uniform thickness different amounts of surface material must be removed at different radii (see FIG. 4, plot A). A thickness of about 4.2 micrometers would have been the thickest possible uniform photoresist layer which could have been obtained. However, a thickness of 3.9 micrometers was chosen in view of the teachings in the copending application of Roach et al. The Table is a listing of the information used to asymmetrically irradiate the photoresist layer top surface.

TABLE I

| Radius (Inches) | Thickness of Photoresist Layer to be Removed (Micrometers) | Local Exposure Time (Seconds) | Radial Angle (Degrees) |
| --- | --- | --- | --- |
| 3 | 0.34 | 16.19 | 12.14 |
| 3.5 | 0.60 | 23.27 | 17.45 |
| 4 | 0.76 | 28.56 | 21.42 |
| 4.5 | 0.91 | 32.12 | 24.09 |
| 5 | 1.04 | 35.37 | 26.53 |
| 5.5 | 1.17 | 37.87 | 28.40 |

The radius is that of the photoresist layer 37 on the substrate 38 as measured from the center of the substrate. The thickness of photoresist to be removed is determined from the value of plot B in FIG. 4 and the decision to have a uniform first photoresist layer 37 thickness of 3.9 micrometers. The local exposure time is empirically determined by finding the thickness of photoresist surface layer removed after a given exposure time using specified exposure and development conditions. After the relationship between exposure time and thickness of photoresist removed has been determined, the local exposure time needed at each radius to remove the thickness of photoresist can be readily determined.

The minimum time the photoresist layer must be exposed is given by the formula $$\text{total exposure time (minutes)} = \frac{\text{local exposure (sec)} \times 6}{\text{radial angle (degrees)}}$$

The maximum radial angle for the wedge opening 60 used in this run was 30°, the angle between sides 68 and 70 when extended to axis point 74. The total exposure value at the 5.5 inch radius was calculated assuming a radial angle of 30° because that radius required the greatest local exposure time. A value of 8 minutes was chosen for the total exposure time which was somewhat larger than the minimum total exposure time of 7.57 minutes.

The radial angle (column 4 Table I) is the angle measured from the first side 68 at axis point 74 on blocking plate 62 and corresponds to the portion of the opening 60 which is not covered by the mask 72. The radial angle is calculated using the formula $$\text{radial angle (degrees)} = \frac{\text{local exposure (sec)} \times 6}{\text{total exposure time (minutes)}}$$

At each radius in column 1 of the Table was measured from axis point 74, the radial angle was determined. The mask was fabricated out of 0.030 inch thick white cardboard.

The mask 72 was attached to the blocking plate 62 and the photoresist layer 37 was rotated and exposed for 8 minutes using the exposure apparatus 50 shown in FIG. 3. The photoresist layer 37 was developed using Shipley AZ aqueous alkaline solvent developer for 3 minutes. After development the photoresist was baked at 50° C. for one hour and the substrate 38 was then allowed to cool to room temperature overnight.

The photoresist layer 37 thickness was again measured interferometrically. A plot of thickness versus radius is shown in plot A of FIG. 4. The photoresist thickness is about 3.9 micrometers for all radii.

We claim:

1. In a method of replicating a spiral groove pattern comprising the steps of:

spin coating a layer of positive photoresist on a substrate;

recording the pattern in the photoresist layer with actinic radiation;

developing the photoresist layer by removing areas of said layer which have been exposed to actinic radiation so that the groove pattern is reproduced in the photoresist layer;

transferring the pattern to a metal layer; and p1 forming the pattern in the surface of a plastic substrate;

the improvement which comprises preparing a photoresist layer having uniform groove depth from a photoresist layer wherein the thickness of said layer varies as a function of the distance from the center point of spin coating by the additional steps of:

asymmetrically irradiating the photoresist surface layer with actinic radiation so that thicker regions receive a greater exposure than thinner regions; and removing the irradiated photoresist surface layer so that the thickness of the remaining photoresist layer is substantially uniform.

2. The method of claim 1 wherein the developing and removing steps are combined.

3. The method of claim 1 wherein the irradiating step occurs prior to the recording step.

4. The method of claim 1 wherein the recording step occurs prior to the irradiating step.

5. The method of claim 1 wherein the spiral groove has a trapezoidal shape.

6. The method of claim 1 wherein the spiral groove is from about 3 to about 5 micrometers deep.

7. A disc plastic substrate prepared according to claim 1.

8. The disc plastic substrate of claim 7 wherein the disc is coated with an abrasive layer.

* * * * *